(12) United States Patent
Takagi

(10) Patent No.: US 12,447,635 B2
(45) Date of Patent: Oct. 21, 2025

(54) COOLING DEVICE FOR ROBOT CONTROLLER

(71) Applicant: NIDEC INSTRUMENTS CORPORATION, Nagano (JP)

(72) Inventor: Hajime Takagi, Nagano (JP)

(73) Assignee: NIDEC INSTRUMENTS CORPORATION, Nagano (JP)

( * ) Notice: Subject to any disclaimer, the term of this patent is extended or adjusted under 35 U.S.C. 154(b) by 214 days.

(21) Appl. No.: 18/327,064

(22) Filed: Jun. 1, 2023

(65) Prior Publication Data

US 2023/0405846 A1 Dec. 21, 2023

(30) Foreign Application Priority Data

Jun. 17, 2022 (JP) ................. 2022-098058

(51) Int. Cl.
*B25J 19/00* (2006.01)
*H05K 7/20* (2006.01)

(52) U.S. Cl.
CPC ...... *B25J 19/0054* (2013.01); *H05K 7/20154* (2013.01); *H05K 7/20209* (2013.01); *H05K 7/20909* (2013.01)

(58) Field of Classification Search
CPC ........... H05K 7/20154; H05K 7/20209; H05K 7/20909; B25J 19/0054
See application file for complete search history.

(56) References Cited

U.S. PATENT DOCUMENTS

| | | | | |
|---|---|---|---|---|
| 6,164,369 A | * | 12/2000 | Stoller | H05K 7/20572 165/104.34 |
| 7,417,861 B2 | * | 8/2008 | Kikuchi | H01L 25/162 257/E25.031 |
| 7,477,530 B2 | | 1/2009 | Tashima et al. | |
| 7,782,641 B2 | | 8/2010 | Tashima et al. | |
| 8,472,181 B2 | * | 6/2013 | Doll | H05K 7/20736 361/752 |
| 8,537,540 B2 | * | 9/2013 | Landon | G06F 1/183 361/679.54 |
| 9,019,706 B2 | * | 4/2015 | Ning | G06F 1/20 361/679.48 |

(Continued)

FOREIGN PATENT DOCUMENTS

| | | |
|---|---|---|
| JP | H06117393 | 4/1994 |
| JP | 2011033479 | 2/2011 |

(Continued)

*Primary Examiner* — Nelson J Nieves
(74) *Attorney, Agent, or Firm* — JCIPRNET

(57) ABSTRACT

A cooling device for a robot controller includes a servo driver having a circuit board and a heat generation element. The cooling device includes a fin member which is attached to the heat generation element, a temperature sensor, a heat conductive sheet which transmits heat generated in the heat generation element to the temperature sensor, a fan which generates an air flow toward the fin member, and a fan control part which controls the fan based on a detection value of the temperature sensor. The heat conductive sheet is disposed between the circuit board and the heat generation element in the servo driver and is contacted with both of the circuit board and the heat generation element, and the temperature sensor is provided on the circuit board and is covered by the heat conductive sheet.

6 Claims, 4 Drawing Sheets

(56) References Cited

U.S. PATENT DOCUMENTS

| | | | | |
|---|---|---|---|---|
| 9,025,332 B2* | 5/2015 | Campbell | | F28D 15/00 |
| | | | | 361/698 |
| 10,488,892 B1* | 11/2019 | Lin | | H05K 7/20145 |
| 11,133,773 B2 | 9/2021 | Nakagawa et al. | | |
| 11,486,895 B2* | 11/2022 | Yanai | | G01R 1/0458 |
| 11,515,237 B2* | 11/2022 | Tang | | H01L 23/3677 |
| 11,943,894 B2* | 3/2024 | Fujisawa | | H05K 7/20136 |
| 2002/0186532 A1* | 12/2002 | Tomioka | | H05K 7/20154 |
| | | | | 361/679.48 |
| 2011/0058330 A1* | 3/2011 | Abraham | | G06F 1/20 |
| | | | | 361/679.54 |
| 2011/0235271 A1* | 9/2011 | Budai | | H05K 7/1439 |
| | | | | 361/752 |
| 2014/0321056 A1* | 10/2014 | Yoshikawa | | H05K 7/20818 |
| | | | | 361/690 |
| 2015/0163964 A1* | 6/2015 | Lam | | G06F 1/187 |
| | | | | 361/679.31 |
| 2017/0150643 A1* | 5/2017 | Sporer | | H05K 7/20154 |
| 2018/0295709 A1* | 10/2018 | Matsuda | | H05K 1/0201 |
| 2020/0068751 A1* | 2/2020 | Tamayama | | H05K 7/20154 |
| 2020/0337180 A1* | 10/2020 | Dawkins | | H05K 7/20145 |
| 2021/0153383 A1* | 5/2021 | Dailey | | G06F 1/20 |
| 2022/0007539 A1* | 1/2022 | Horie | | H05K 7/20409 |
| 2022/0255154 A1* | 8/2022 | Dong | | H01M 10/482 |
| 2022/0258362 A1* | 8/2022 | Fujisawa | | B25J 19/0054 |
| 2023/0058602 A1* | 2/2023 | Ono | | H05K 7/20154 |
| 2023/0200009 A1* | 6/2023 | Gao | | H05K 7/20809 |
| | | | | 361/434 |
| 2023/0241762 A1* | 8/2023 | Teranaka | | H05K 7/20136 |
| | | | | 700/245 |
| 2023/0244286 A1* | 8/2023 | Yang | | G06F 1/206 |
| | | | | 713/340 |
| 2023/0284416 A1* | 9/2023 | Malouin | | H05K 7/20772 |
| | | | | 361/696 |
| 2023/0413487 A1* | 12/2023 | Chen | | H01L 23/427 |
| 2024/0074031 A1* | 2/2024 | Bradford | | H05K 1/05 |
| 2024/0130056 A1* | 4/2024 | Snygg | | H05K 5/0214 |
| 2024/0251533 A1* | 7/2024 | Byers | | H05K 7/20936 |
| 2024/0276665 A1* | 8/2024 | Takagi | | H05K 7/20145 |
| 2024/0300121 A1* | 9/2024 | Scafato | | H05K 7/20154 |
| 2025/0008695 A1* | 1/2025 | Best | | H05K 7/2039 |

FOREIGN PATENT DOCUMENTS

| | | |
|---|---|---|
| JP | 4796841 | 10/2011 |
| JP | 5486434 | 5/2014 |
| JP | 6498371 | 4/2019 |

* cited by examiner

COOLING DEVICE FOR ROBOT CONTROLLER

CROSS REFERENCE TO RELATED APPLICATION

The present invention claims priority under 35 U.S.C. § 119 to Japanese Application No. 2022-098058 filed Jun. 17, 2022, the entire content of which is incorporated herein by reference.

TECHNICAL FIELD

At least an embodiment of the present invention may relate to a cooling device for a robot controller.

BACKGROUND

In an industrial robot, a motor is provided in each of axes for driving the axis in a manipulator (robot main body). A robot controller used for controlling a manipulator includes a servo driver which drives and controls a motor corresponding to each axis. When the manipulator has eight axes, the robot controller also has eight servo drivers. A motor provided in a manipulator is, for example, a three-phase motor and thus, a servo driver includes an inverter circuit which generates three-phase AC power supplied to a corresponding motor by, for example, PWM (pulse width modulation). The inverter circuit is provided with two serially-connected switching elements which are referred to as a high side switch and a low side switch for every phase of the motor. As the switching element, for example, a semiconductor element such as a power MOSPET (metal-oxide-semiconductor field effect transistor) or an IGBT (insulated gate type bipolar transistor) is used. In recent years, an IPM (intelligent power module) is widely used which accommodates a plurality of switching elements configuring an inverter circuit, a gate drive circuit which drives gates of the switching elements, a protection circuit and the like in one package.

In a case that AC power is generated by an inverter circuit to drive a motor, switching elements in the inverter circuit generate heat. A switching element which is a semiconductor element is required so that its junction temperature does not exceed a predetermined rated maximum value. Therefore, a heat radiation fin member referred to as a heat sink is provided in the switching element and a cooling fan flows an air flow along the fin member to cool the switching element. Also in a case that an IPM is used, a similar means is used for cooling. A cooling fan is rotationally driven by a motor referred to as a fan motor. Conventionally, a fan is always operated at a maximum air quantity. However, it is disadvantageous from viewpoints of power consumption and a service life of a fan motor, and it has been proposed that a fan is driven only when necessary with a necessary air quantity. For example, Japanese Patent Laid-Open No. Hei 6-117393 (Patent Literature 1) discloses that, when an inverter circuit used in a servo driver is to be cooled, a heat generation quantity is obtained based on a command to the servo driver to control on/off of rotation of the fan and a rotation number of the fan. Japanese Patent No. 4796841 (Patent Literature 2) discloses that a temperature is estimated by calculating electric power consumed as heat in a switching element based on an output current of a power conversion circuit such as an inverter circuit, and a cooling fan is controlled based on the estimated temperature. Japanese Patent No. 5486434 (Patent Literature 3) discloses that a junction temperature of a switching element is estimated based on an output current from an inverter circuit, an air quantity at a fin member and a temperature around the switching element, and a cooling fan is controlled based on the estimated junction temperature.

An electrolytic capacitor is often used in a power supply circuit and the like for smoothing, but it has a property that its lifetime is shortened when an ambient temperature is high. Japanese Patent No. 6498371 (Patent Literature 4) discloses that, when a cooling fan used for cooling a semiconductor element also cools an electrolytic capacitor, an air flow quantity by the fan is controlled based on a relationship between an air flow quantity by the fan, a lifetime of the fan and a lifetime of the electrolytic capacitor. Further, Japanese Patent Laid-Open No. 2011-33479 (Patent Literature 5) discloses that, as a temperature sensor which is capable of accurately measuring a temperature of an electronic component such as a semiconductor element, a heat conductive sheet is provided between an electronic component and a board on which the electronic component is mounted or a heat dissipation plate attached to the electronic component so that the heat conductive sheet is tightly contacted with these members, and a heat sensitive element is provided in the heat conductive sheet.

In the techniques described in Patent Literatures 1 through 4, when heat generated in a servo driver provided in a robot controller is to be eliminated by using a cooling fan, a junction temperature of the switching element which is a heat generation element is only estimated and thus, it is difficult to finely control the cooling fan based on an actual temperature of the heat generation element.

SUMMARY

At least an embodiment of the present invention may advantageously provide a cooling device for a robot controller which is capable of performing fine control based on a temperature of a heat generation element included in a servo driver which is provided in a robot controller.

According to at least an embodiment of the present invention, there may be provided a cooling device for a robot controller which includes a servo driver having a circuit board and a heat generation element. The cooling device includes a fin member which is attached to the heat generation element, a temperature sensor, a heat conductive sheet which transmits heat generated in the heat generation element to the temperature sensor, a fan which generates an air flow toward the fin member, and a fan control part which controls the fan based on a detection value of the temperature sensor. The heat conductive sheet is disposed between the circuit board and the heat generation element in the servo driver and is contacted with both of the circuit board and the heat generation element, and the temperature sensor is provided on the circuit board and is covered by the heat conductive sheet.

In the cooling device in accordance with an embodiment of the present invention, heat is transmitted to a temperature sensor provided on a circuit board through a heat conductive sheet and thus, the temperature sensor is capable of detecting an actual temperature of the heat generation element. As a result, fine control of a cooling fan can be performed based on an actual temperature of the heat generation element and thus, power consumption of the fan can be reduced and a long lifetime of the fan can be attained.

In the cooling device in accordance with an embodiment of the present invention, the fan control part controls an air quantity generated by the fan so that a temperature measured by the temperature sensor does not exceed a predetermined value. When the control is performed, a temperature of the heat generation element can be prevented from excessively increasing.

In the cooling device in accordance with an embodiment of the present invention, in a case that the robot controller includes a plurality of the servo drivers, it may be structured that an air flow generated by one fan is divided to flow along each of the fin members of the plurality of the servo drivers. According to this structure, the number of fans can be reduced, a space in the robot controller can be effectively utilized, and a size of the robot controller can be reduced. In this case, the fan control part controls an air quantity generated by the fan so that a temperature measured by the temperature sensor provided in each of the plurality of the servo drivers does not exceed the predetermined value. When the control is performed, in each of the servo drivers, a temperature of the heat generation element of the servo driver can be prevented from excessively increasing.

In the cooling device in accordance with an embodiment of the present invention, the heat generation element is a semiconductor element configuring an inverter circuit and, in this case, the predetermined value is a value which is determined based on a rated maximum value of a junction temperature of the semiconductor element. When the predetermined value is determined as described above, control which optimizes operation of the fan can be performed in a range that a junction temperature of the semiconductor element does not exceed a rated maximum value.

Effects of the Invention

According to the present invention, a cooling device for a robot controller is obtained which is capable of performing fine control based on a temperature of a heat generation element included in a servo driver which is provided in the robot controller.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Figure 1:
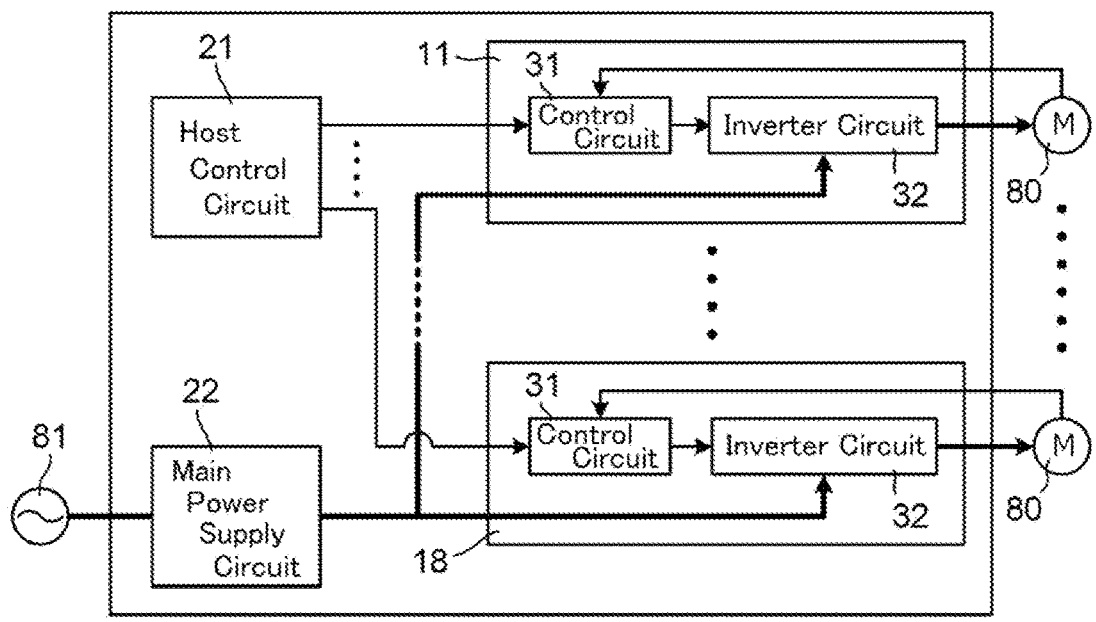
FIG. 1 is a block diagram showing a robot controller in accordance with an embodiment of the present invention.

An embodiment of the present invention will be described below with reference to the accompanying drawings. FIG. 1 is a block diagram showing a configuration of a robot controller to which a cooling device in accordance with an embodiment of the present invention is incorporated. The robot controller is capable of controlling an 8-axis manipulator and includes eight servo drivers 11 through 18 corresponding to eight motors 80 which are provided in the manipulator. In addition, the robot controller includes a host control circuit 21 which transmits commands to the servo drivers 11 through 18, and a main power supply circuit 22 which receives and rectifies AC power supplied from an external power supply 81. Each of the servo drivers 11 through 18 includes a control circuit 31 which performs an operation for servo-controlling its motor 80 based on a command from the host control circuit 21, and an inverter circuit 32 which generates AC power for driving the motor 80 based on the operation result of the control circuit 31. The control circuit 31 is fed back with a signal indicating a position of the motor 80 from an encoder (not shown) attached to the corresponding motor 80. The inverter circuit 32 is supplied with DC power from the main power supply circuit 22. As described above, the inverter circuit 32 includes a switching element such as an IGBT for generating three-phase AC power, which is supplied to the motor 80, from the DC power. In this embodiment, as the inverter circuit 32, an IPM 41 (see FIG. 2) is used in which the switching element, its gate drive circuit, a protection circuit and the like are accommodated in one package. The switching element generates much heat with the operation and thus the switching element is a heat generation element.

Figure 2:
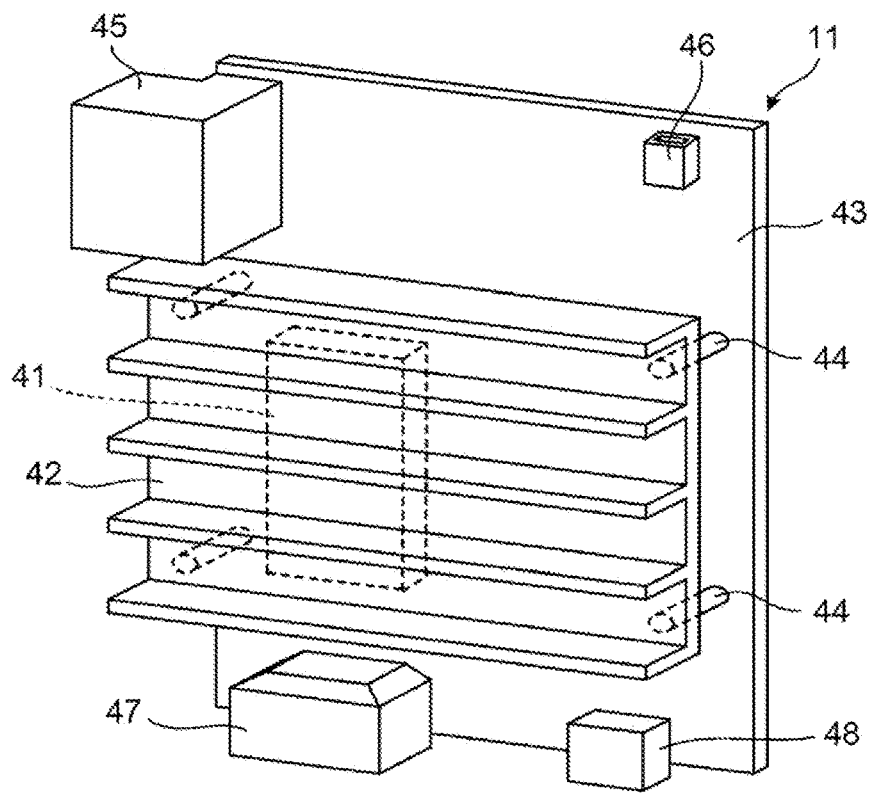
FIG. 2 is a schematic perspective view showing a servo driver.

Next, the servo drivers 11 through 18 will be described below. The servo drivers 11 through 18 have the same configuration as each other and thus, only the servo driver 11 will be described below. FIG. 2 is a schematic perspective view showing the servo driver 11. The IPM 41 which is a heat generation element and configures the inverter circuit 32 is attached to a fin member (heat sink) 42 for heat radiation by a screw 54 (see FIG. 3C). Further, the fin member 42 is attached to a circuit board 43 through spacers 44 so as to have a predetermined space with respect to one face of the circuit board 43. The fin member 42 is formed in a shape that a plurality of fins in a ridge shape is provided on a plate-shaped bottom plate so as to be mutually parallel to each other. In this embodiment, the bottom plate of the fin member 42 is disposed in parallel with the circuit board 43, and the IPM 41 is attached to the bottom plate of the fin member 42. As described below, an air flow toward the fin member 42 is generated by fans 71 and 72 (see FIG. 4) and thereby, the IPM 41 which is a heat generation element is cooled. One face of the circuit board 43 is provided with a connector 45 for supplying AC power to the motor 80, connectors 46 and 48 for signal, and a connector 47 for receiving DC power from the main power supply circuit 22. In the connectors 46 and 48 for signal, the connector 48 is used for both of communication with an encoder attached to the motor 80 and communication with the host control circuit 21.

Figure 3A:
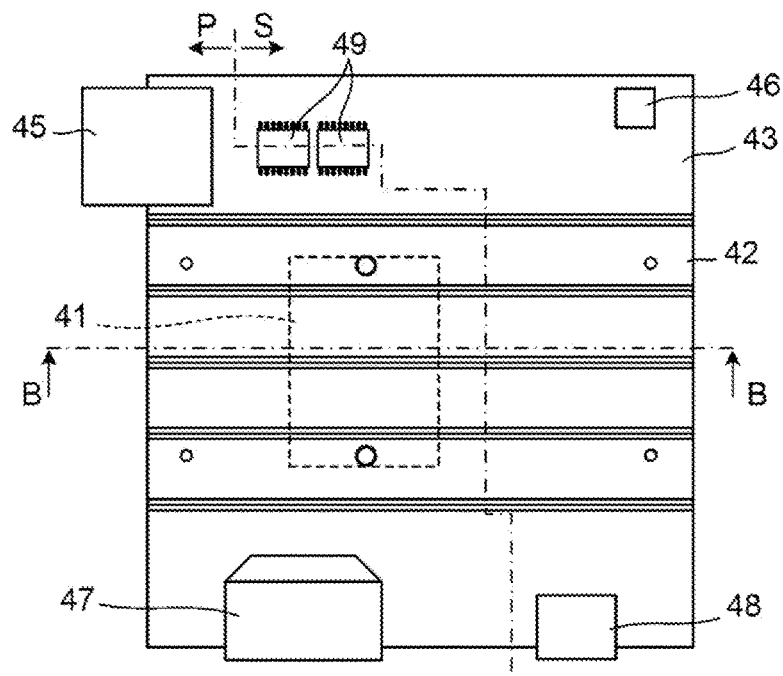
FIG. 3A is a plan view showing a servo driver.
Figure 3B:
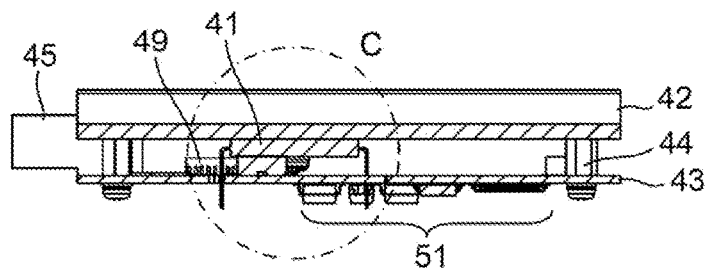
FIG. 3B is a cross-sectional view showing the servo driver which is cut by the "B-B" line in FIG. 3A.
Figure 3C:
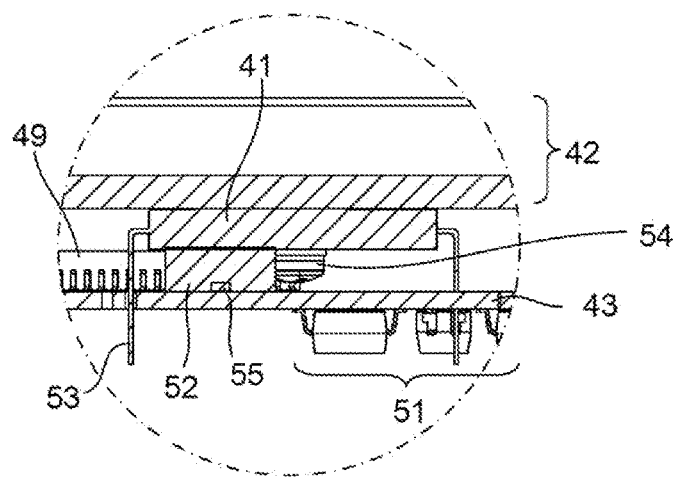
FIG. 3C is an enlarged view showing the "C" part in FIG. 3B.

FIG. 3A is a plan view showing the servo driver 11, FIG. 3B is a cross-sectional view showing the servo driver 11 which is cut by the "B-B" line in FIG. 3A, and FIG. 3C is an enlarged view showing the "C" part in FIG. 3B. In the servo driver 11, basically, the control circuit 31 handles a logic signal of several volts or less, and the inverter circuit 32 handles dangerous voltage defined by safety standards for driving the motor 80. Therefore, in order to ensure safety and the like, as shown in FIG. 3A, the circuit board 43 is divided into a region "P" and a region "S", and the inverter circuit 32 and its related circuit are disposed in the region "P" and the control circuit 31 is disposed in the region "S". The connectors 45 and 47 which handle high power are disposed in the region "P" and the connectors 46 and 48 for signal are disposed in the region "S". Communication of a signal between the control circuit 31 and the inverter circuit 32 is performed through a photocoupler 49 which is provided on the circuit board 43 so as to connect the region "P" with the region "S".

As described above, the fin member 42 is attached to one of faces (one side face) of the circuit board 43 through the spacers 44 and, in this state, the IPM 41 attached to the fin member 42 faces the one side face of the circuit board 43. Further, connection pins 53 of the IPM 41 are extended toward and penetrated through the circuit board 43, and the connection pins 53 are soldered to the circuit board 43 at the position. A space between the IPM 41 and the circuit board 43 is disposed with a heat conductive sheet 52 so as to fill the space. Further, a temperature sensor 55 is provided on the one side face of the circuit board 43 so as to face the IPM 41 with the heat conductive sheet 52 interposed therebetween. The temperature sensor 55 is covered by the heat conductive sheet 52. The temperature sensor 55 is provided in the region "P" where high power is handled and thus, the temperature sensor 55 which outputs a pulse signal based on a temperature having been measured may be used, and an output result of the temperature sensor 55 is transmitted to the region "S" through the photocoupler 49 and the like. The other side face of the circuit board 43 is provided with a circuit element group 51 which configures the control circuit 31.

The heat conductive sheet 52 may be an insulating sheet having adhesiveness. For example, as described in Patent Literature 5, the heat conductive sheet 52 is a sheet which is made of material such as acryl, silicone rubber, elastomer-based silicon, glass fiber, dielectric film or polyester film, and its heat conductivity is relatively large. The heat conductive sheet 52 is provided for further accurately measuring a junction temperature in the IPM 41 by the temperature sensor 55. Therefore, the heat conductive sheet 52 is required to contact with both of a face of the IPM 41 and the one side face of the circuit board 43, and the heat conductive sheet 52 may be tightly contacted with them. When the heat conductive sheet 52 is contacted with the one side face of the circuit board 43, the temperature sensor 55 disposed on the one side face of the circuit board 43 is set in a state substantially embedded in the heat conductive sheet 52.

Figure 4:
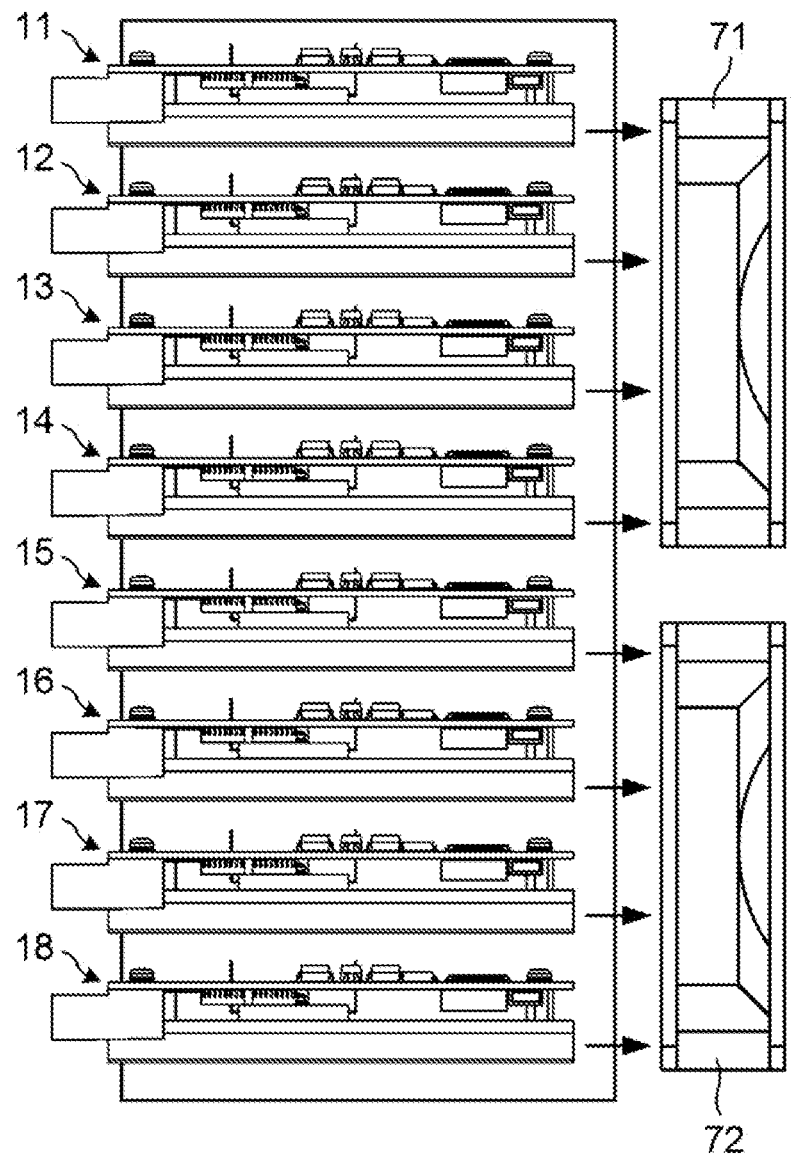
FIG. 4 is a schematic front view showing arrangement of servo drivers and cooling fans in a robot controller.

FIG. 4 is a view showing actual arrangement of the servo drivers 11 through 18 in the robot controller. Eight servo drivers 11 through 18 are arranged so as to stack at equal intervals in a thickness direction of the circuit board 43. Further, cooling fans 71 and 72 are provided. The fans 71 and 72 are arranged so that air flows generated by the fans 71 and 72 are divided into the respective servo drivers 11 through 18 and flow along fins of the fin members 42 of the respective servo drivers 11 through 18. The air flows by the fans 71 and 72 are shown by the arrows in the drawing. In the example shown in the drawing, four servo drivers 11 through 14 on an upper side in the drawing are cooled by an air flow generated by the fan 71, and four servo drivers 15 through 18 on a lower side in the drawing is cooled by an air flow generated by the fan 72. In the robot controller, rotation amounts of the fans 71 and 72, in other words, air quantities generated by the fans 71 and 72 are controlled based on temperatures measured by the temperature sensors 55 which are respectively provided in the servo drivers 11 through 18. In order to perform such control, the fans 71 and 72 are used whose air quantities being generated can be changed by varying its drive voltage or by changing the PWM duty ratio of a control signal supplied to the fans 71 and 72. Next, control for the fans 71 and 72 based on temperatures measured by the temperature sensors 55 will be described below.

Figure 5:
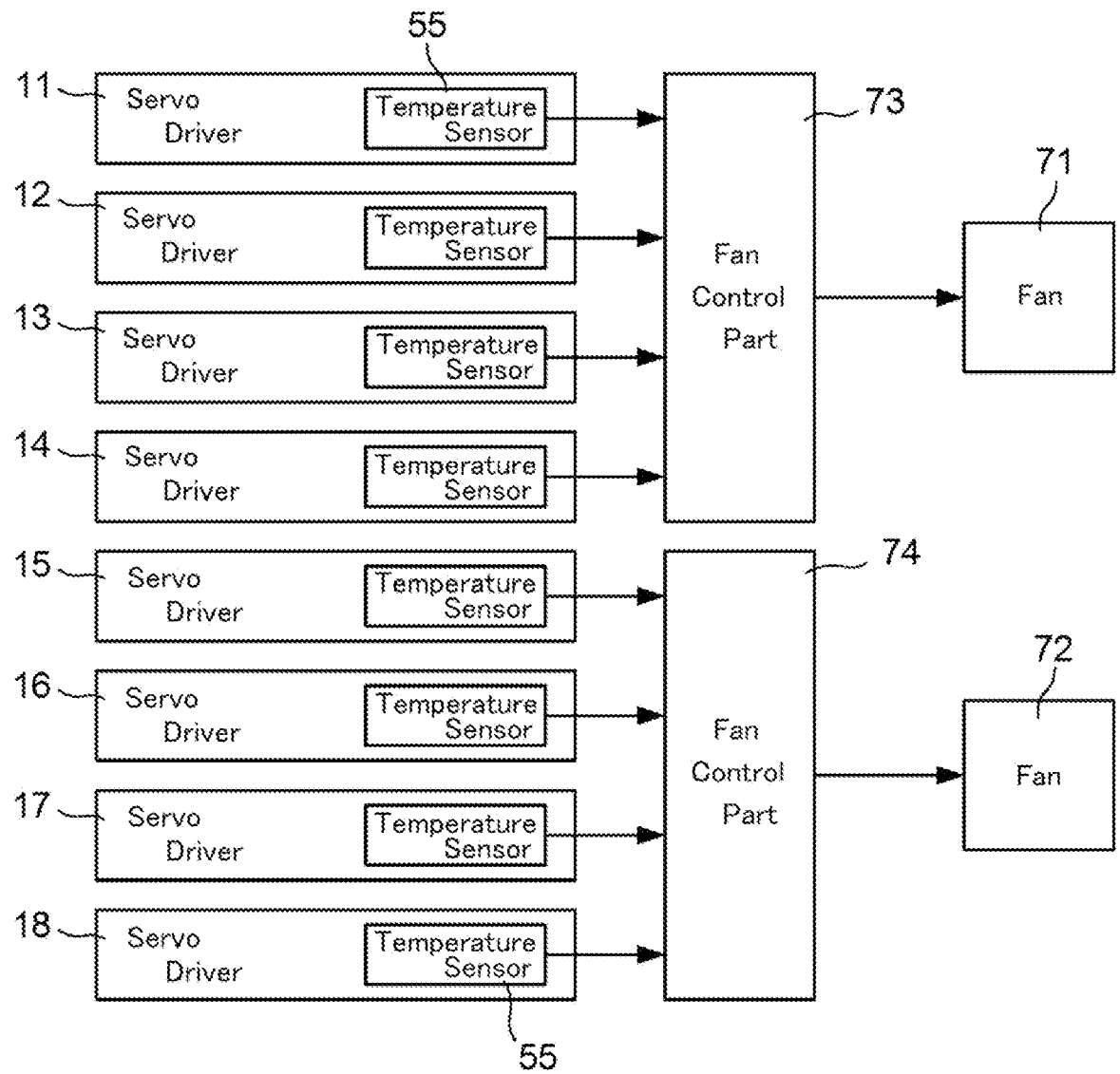
FIG. 5 is a block diagram showing a mechanism which controls cooling fans.

FIG. 5 is a block diagram showing a mechanism for controlling the fans 71 and 72. Each of the servo drivers 11 through 18 is provided with the temperature sensor 55, and there is a fan control part 73 into which signals from the temperature sensors 55 of the servo drivers 11 through 14 on an upper side in the drawing are inputted, and a fan control part 74 into which signals from the temperature sensors 55 of the servo drivers 15 through 18 on a lower side in the drawing are inputted. The fan control part 73 controls an air quantity generated by the fan 71 so that each of temperatures measured by the temperature sensors 55 of the servo drivers 11 through 14 does not exceed a predetermined value. The predetermined value is a value which is determined based on a rated maximum value of the junction temperature specified in the IPM 41. Similarly, the fan control part 74 controls a fan motor which drives the fan 72 so that each of temperatures measured by the temperature sensors 55 of the servo drivers 15 through 18 does not exceed a predetermined value. The fan control parts 73 and 74 are separately provided from the servo drivers 11 through 18 in the robot controller. It may be configured that the function of the fan control parts 73 and 74 is provided in the host control circuit 21. When configured as described above, in the robot controller, the fans 71 and 72 can be driven in an optimized manner while a junction temperature of a heat generation element does not exceed a rated maximum value, the lifetimes of the fans 71 and 72 can be extended, and power consumption of the fans 71 and 72 can be reduced.

In this embodiment, heat is conducted to the temperature sensor 55 provided on the surface of the circuit board 43 through the heat conductive sheet 52 which is tightly contacted with the IPM 41 and the circuit board 43. As a result, it is estimated that a temperature which is measured by the temperature sensor 55 further accurately indicates a junction temperature of a switching element in the IPM 41 in comparison with a junction temperature estimated from an output current or the like of the inverter circuit 32. Therefore, according to this embodiment, drive of the fans 71 and 72 can be further finely controlled based on a junction temperature of a switching element and thus, lifetimes of the fans 71 and 72 can be largely extended and power consumption of the fans 71 and 72 can be also remarkably reduced. Especially, in an industrial robot, a motor 80 of each axis is usually driven intermittently and heat generation in the servo drivers 11 through 18 is small when averaged in time and thus, effects for reducing power consumption and extending a lifetime of a fan are remarkably attained by applying the control in this embodiment to a robot controller. Further, in a robot controller, specifications of motors may be different from each other for each robot which is to be connected with the robot controller and thus, heat generations in the servo drivers 11 through 18 may be different from each other. However, when this embodiment is applied, even when speeds of the fans 71 and 72 are not individually set for each robot which is connected with the robot controller, the fans 71 and 72 can be always driven for obtaining an optimum air quantity.

Each of the servo drivers 11 through 18 which is provided with the circuit board 43 and the fin member 42 having a bottom plate disposed in parallel with the circuit board 43 has a flat shape as a whole, and the fin member 42 is exposed on the flat face. On the other hand, the cooling fans 71 and 72 are formed in a square frame shape so that rotating blades can be accommodated. When a cooling fan is provided for every servo driver which is formed in a flat shape, utilization efficiency of a space in the robot controller is lowered. However, in this embodiment, a plurality of the servo drivers is cooled by one fan and thus, utilization efficiency of a space in the robot controller can be enhanced. In the example described above, four servo drivers are cooled by one fan, but the number of the servo drivers cooled by one fan is not limited to four. In a case that the number of the servo drivers is changed depending on the number of motors provided in a robot, the number of fans may be increased or decreased according to the number of the servo drivers. Further, in the example shown in FIG. 4, the servo drivers 11 through 18 are arranged on an upstream side with respect to the fans 71 and 72, and air flows sucked by the fans 71 and 72 are generated to direct toward the fin members 42. However, a positional relationship between the fin member and the fan in accordance with an embodiment of the present invention is not limited to this structure, and it may be structured that the fin members are arranged on a downstream side with respect to a fan so that an air flow discharged from the fan flows toward the fin members.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A cooling device for a robot controller comprising a servo driver having a control circuit, a circuit board and a heat generation element, wherein the heat generation element is a semiconductor element configuring an inverter circuit that drives a motor, the cooling device comprising:
   a fin member which is attached to the heat generation element;
   a temperature sensor;
   a heat conductive sheet which transmits heat generated in the heat generation element to the temperature sensor;
   a fan which generates an air flow toward the fin member; and
   a fan control part which controls the fan based on a detection value of the temperature sensor;
   wherein the heat conductive sheet is disposed between the circuit board and the heat generation element in the servo driver and is contacted with both of the circuit board and the heat generation element,
   the temperature sensor is provided on a first surface of the circuit board and is covered by the heat conductive sheet,
   the control circuit is provided on a second surface of the circuit board opposite to the first surface, and
   the temperature sensor does not overlap the control circuit when viewed in a thickness direction of the circuit board.

2. The cooling device according to claim 1, wherein the fan control part controls an air quantity generated by the fan so that a temperature measured by the temperature sensor does not exceed a predetermined value.

3. The cooling device according to claim 1, wherein
   the servo driver comprises a plurality of servo drivers,
   the fin member comprises a plurality of fin members respectively disposed on the plurality of servo drivers,
   the robot controller comprises the plurality of servo drivers, and
   an air flow generated by the fan is divided to flow along each of the plurality of fin members.

4. The cooling device according to claim 3, wherein the fan control part controls an air quantity generated by the fan so that a temperature measured by the temperature sensor provided in each of the plurality of servo drivers does not exceed a predetermined value.

5. The cooling device according to claim 2, wherein
   the predetermined value is a value which is determined based on a rated maximum value of a junction temperature of the semiconductor element.

6. The cooling device according to claim 4, wherein
   the predetermined value is a value which is determined based on a rated maximum value of a junction temperature of the semiconductor element.

* * * * *